(12) United States Patent
Sumita et al.

(10) Patent No.: US 10,407,536 B2
(45) Date of Patent: Sep. 10, 2019

(54) HEAT-CURABLE RESIN COMPOSITION FOR SEMICONDUCTOR ENCAPSULATION

(71) Applicant: Shin-Etsu Chemical Co., Ltd., Tokyo (JP)

(72) Inventors: Kazuaki Sumita, Annaka (JP); Naoyuki Kushihara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/905,039

(22) Filed: Feb. 26, 2018

(65) Prior Publication Data

US 2018/0186925 A1    Jul. 5, 2018

Related U.S. Application Data

(62) Division of application No. 15/202,870, filed on Jul. 6, 2016.

(30) Foreign Application Priority Data

Jul. 7, 2015    (JP) .................................. 2015-135799

(51) Int. Cl.

| | |
|---|---|
| *C08G 61/10* | (2006.01) |
| *C08G 73/02* | (2006.01) |
| *C08G 73/00* | (2006.01) |
| *H01L 23/29* | (2006.01) |

(Continued)

(52) U.S. Cl.
CPC ............. *C08G 61/10* (2013.01); *C08G 73/00* (2013.01); *C08G 73/026* (2013.01); *C08K 9/06* (2013.01); *H01L 21/56* (2013.01); *H01L 23/295* (2013.01); *C08G 2190/00* (2013.01);

(Continued)

(58) Field of Classification Search
None
See application file for complete search history.

(56) References Cited

U.S. PATENT DOCUMENTS

| | | |
|---|---|---|
| 5,656,862 A | 8/1997 | Papathomas et al. |
| 2010/0248427 A1 | 9/2010 | Wu et al. |
| 2012/0164464 A1* | 6/2012 | Tang et al. .................... 428/463 |

(Continued)

FOREIGN PATENT DOCUMENTS

| | | |
|---|---|---|
| EP | 2952539 A1 | 12/2015 |
| EP | 3037492 A1 | 6/2016 |

(Continued)

OTHER PUBLICATIONS

Extended European Search Report for European Application No. 16177990.5, dated Nov. 15, 2016.

*Primary Examiner* — Angel Roman
(74) *Attorney, Agent, or Firm* — Birch, Stewart, Kolasch & Birch, LLP

(57) ABSTRACT

Provided is a versatile heat-curable resin composition for semiconductor encapsulation that has a favorable water resistance and abradability, and exhibits a superior fluidity and a small degree of warpage even when used to perform encapsulation on a large-size wafer.
The heat-curable resin composition of the invention contains:
(A) a cyanate ester compound having not less than two cyanato groups in one molecule;
(B) a phenol curing agent containing a resorcinol-type phenolic resin;
(C) a curing accelerator; and
(D) a spherical inorganic filler.

5 Claims, 1 Drawing Sheet

(51) Int. Cl.
*H01L 21/56* (2006.01)
*C08K 9/06* (2006.01)

(52) U.S. Cl.
CPC . *C08G 2261/143* (2013.01); *C08G 2261/312* (2013.01); *C08K 2201/003* (2013.01)

(56) References Cited

U.S. PATENT DOCUMENTS

2012/0178853 A1* 7/2012 Ogawa et al. ................ 523/457
2013/0113083 A1   5/2013 Kondo et al.
2015/0028497 A1   1/2015 Nakamura et al.
2018/0057663 A1* 3/2018 Sumita ............... C08G 73/0655

FOREIGN PATENT DOCUMENTS

| JP | 11-289034 A | 10/1999 |
| JP | 2012-209453 A | 10/2012 |
| JP | 2014-229771 A | 12/2014 |

* cited by examiner

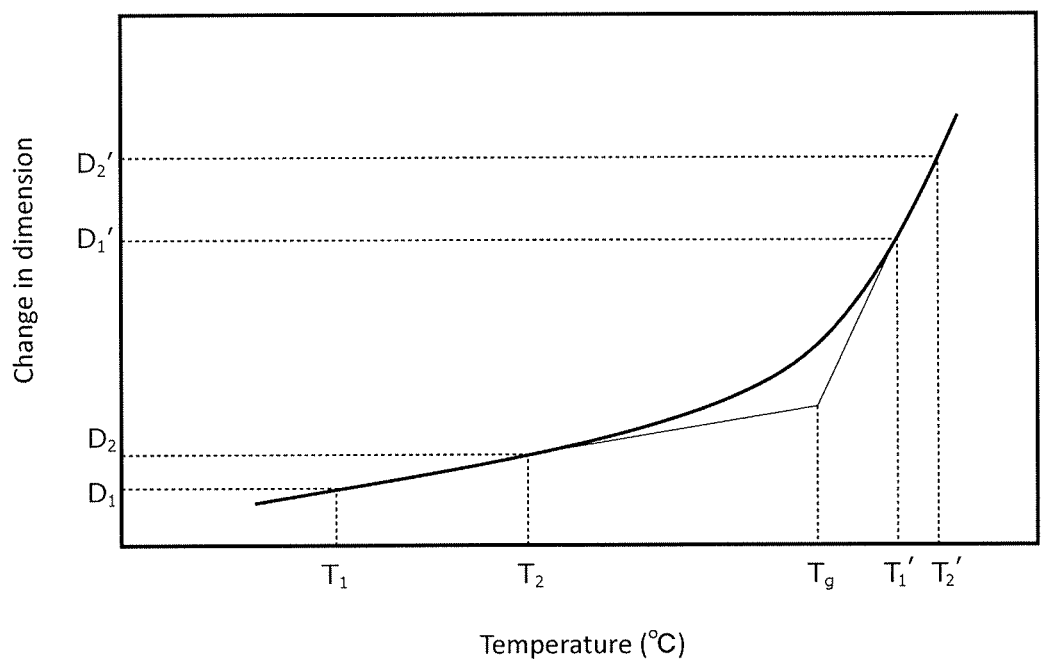

HEAT-CURABLE RESIN COMPOSITION FOR SEMICONDUCTOR ENCAPSULATION

CROSS-REFERENCE TO RELATED APPLICATIONS

This application is a Divisional of copending application Ser. No. 15/202,870, filed on Jul. 6, 2016, which claims priority under 35 U.S.C. § 119(a) to Application No. 2015-135799, filed in Japan on Jul. 7, 2015, all of which are hereby expressly incorporated by reference into the present application.

BACKGROUND OF THE INVENTION

Field of the Invention

The present invention relates to a heat-curable resin composition for semiconductor encapsulation; and a semiconductor device encapsulated by such resin composition.

Background Art

In recent years, semiconductor devices have undergone a tremendous technical innovation. In order for mobile information-communication terminals such as smart phones and tablets to be able to process a large volume of information at a high speed, a TSV (Through Silicon Via) technology is employed to connect semiconductor elements through multi-layer bonding, followed by performing flip chip bonding on the multilayered semiconductor elements on an 8-inch or 12-inch silicon interposer, and then using a heat-curable resin to encapsulate each interposer with a plurality of the multilayered semiconductor elements mounted thereon. The encapsulated package is then divided after abrading the unwanted cured resin on the semiconductor elements, thus obtaining a thin and downsized multifunctional semiconductor device capable of performing high-speed processing.

Encapsulation molding can be performed without a major problem even with the current situation, if using a substrate such as a small-diameter wafer of a size of about 8 inch. However, an epoxy resin or the like tends to exhibit a significant contraction stress after encapsulation, in the case of performing molding on a wafer of a size of not smaller than 12 inches, on a 20-inch wafer in recent years or on a panel of a size of larger than 20 inches. For this reason, there has been a problem that a semiconductor element(s) will be stripped off from a substrate made of a metal or the like in such case, which makes it impossible to conduct mass production. In order to solve the aforementioned problems associated with the increases in diameters of wafers, glass substrates and metal substrates, it has been required that a resin be filled with a filler by an amount of not smaller than 90% by mass, or that a contraction stress at the time of curing be reduced through a reduction in elasticity of a resin (JP-A-2012-209453).

However, in the case where an entire silicon interposer is to be encapsulated by a heat-curable resin, a significant warpage will occur due to a difference in thermal expansion coefficient between the silicon and heat-curable resin. A significant warpage makes it unsuitable to perform an abrading step and a dicing step later. That is, it has been a major technical issue to prevent warpage. In addition, encapsulated layers are getting thicker in recent years due to stacked semiconductor elements. Thus, a mainstream semiconductor device has been that of thin-type obtained by abrading the encapsulated resin layer (JP-A-2014-229771).

Conventionally, there has been used an encapsulation material prepared by filling a composition containing an epoxy resin and a curing agent such as an acid anhydride and a phenolic resin with a filler by an amount of not smaller than 85% by mass, and then adding a rubber and/or a thermoplastic resin thereto for stress relaxation. This type of composition bears a problem that a warpage will change due to a thermal history associated with a step(s) in 3D packaging, and that such warpage will then lead to damages of a semiconductor(s) or even the breakage of a wafer itself. Meanwhile, since a typical low-elastic resin material such as a conventional silicone compound is a soft resin, there have been problems that the soft resin will lead to resin clogging when being abraded, and that resin cracks will occur during a reliability test (JP-A-Hei 11-289034).

SUMMARY OF THE INVENTION

It is an object of the present invention to provide a highly versatile heat-curable resin composition for semiconductor encapsulation that has a favorable water resistance and abradability, and exhibits a superior fluidity and a small degree of warpage even when used to encapsulate a semiconductor element(s) on a large-size wafer.

The inventors of the present invention diligently carried out a series of studies, and completed the invention as follows. That is, the inventors found that the above objectives could be achieved by a heat-curable resin composition obtained by combining a particular cyanate ester compound, a particular phenol curing agent and a particular inorganic filler. The present invention is to provide the following heat-curable resin composition for semiconductor encapsulation; and method for producing a resin-encapsulated semiconductor device using a cured product of such composition.

[1]

A heat-curable resin composition for semiconductor encapsulation, comprising:

(A) a cyanate ester compound having not less than two cyanato groups in one molecule, the cyanate ester compound containing a cyanate ester compound (A-1) represented by the following formula (1) and exhibiting a viscosity of not higher than 50 Pa·s when measured by a B-type rotary viscometer at 23° C. in accordance with a method described in JIS K7117-1:1999

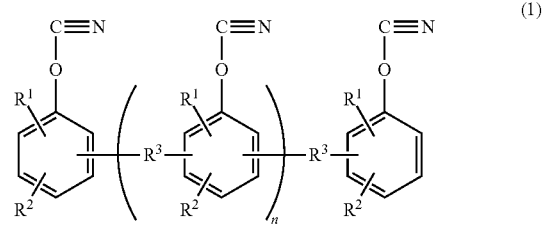

wherein n represents an integer of 0 or 1; each of $R^1$ and $R^2$ represents a hydrogen atom or an alkyl group having 1 to 4 carbon atoms; and $R^3$ represents a divalent linking group selected from the groups expressed by the following formulae (2) to (5)

$$—CH_2— \qquad (2)$$

-continued (3)

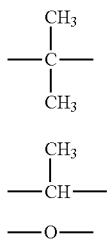

(4)

$$\mathrm{CH_3} \atop {-\mathrm{CH}-}$$

(5)

—O—

(B) a phenol curing agent containing a resorcinol-type phenolic resin represented by the following formula (6)

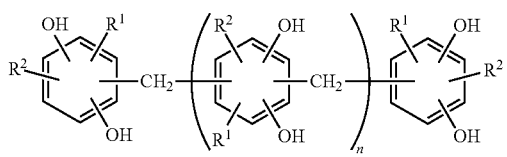

(6)

wherein n represents an integer of 0 to 10; each of $R^1$ and $R^2$ independently represents a hydrogen atom or a monovalent group selected from the group consisting of an alkyl group having 1 to 10 carbon atoms, an allyl group and a vinyl group;
(C) a curing accelerator; and
(D) an inorganic filler that is spherical, has an average particle diameter of 1 to 20 μm when measured by a laser diffraction method, has been surface-treated with a silane coupling agent represented by the following formula (7) and is added in an amount of 1,200 to 2,200 parts by mass with respect to 100 parts by mass of a sum total of the components (A) and (B)

$$R^1_a(OR^2)_{(3-a)}Si-C_3H_6-R^3 \qquad (7)$$

wherein a represents an integer of 0 to 3; $R^1$ represents a methyl group or an ethyl group; $R^2$ represents an alkyl group having 1 to 3 carbon atoms; and $R^3$ represents a group selected from the group consisting of the nitrogen-containing functional groups represented by the following formulae (8) to (11).

—NH$_2$ (8)

—NHC$_6$H$_5$ (9)

—NHC$_2$H$_4$NH$_2$ (10)

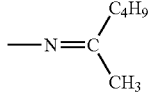

(11)

[2]
The heat-curable resin composition for semiconductor encapsulation according to [1], wherein the component (A) contains two or more kinds of cyanate ester compounds including at least one kind of the cyanate ester compound (A-1), and the cyanate ester compound (A-1) is in an amount of not smaller than 90% by mass, but smaller than 100% by mass with respect to a whole amount of the component (A) added.

[3]
The heat-curable resin composition for semiconductor encapsulation according to [1] or [2], wherein the resorcinol-type phenolic resin represented by the following formula (6) is in an amount of 10 to 100% by mass with respect to a whole amount of the component (B) added, and cyanato groups in the cyanate ester compound as the component (A) are in an amount of 0.5 to 100 equivalents with respect to 1 equivalent of hydroxyl group in the phenol curing agent as the component (B).

[4]
The heat-curable resin composition for semiconductor encapsulation according to any one of [1] to [3], wherein a linear expansion coefficient thereof is in a range of 3.0 to 5.0 ppm/° C. as a result of measuring a specimen of a size of 5×5×15 mm at an increasing rate of 5° C./min from 25 to 300° C. while constantly applying a pressure of 19.6 mN, in accordance with a method described in JIS K 7197:2012.

[5]
A production method of a resin-encapsulated semiconductor device, comprising:
  a step of collectively encapsulating an entire silicon wafer or entire substrate with at least one semiconductor element mounted thereon by a cured product of the heat-curable resin composition for semiconductor encapsulation as set forth in any one of [1] to [4],
  wherein
  the silicon wafer or substrate has an area of 200 to 1,500 cm², and the silicon wafer or substrate exhibits an amount of warpage of not larger than 2 mm after encapsulation.

[6]
The production method of the resin-encapsulated semiconductor device according to [5], wherein in the step of the collective encapsulation, the semiconductor element is encapsulated by covering the semiconductor element with the heat-curable resin composition under a pressed condition or under a depressed condition in vacuum, and then heating and curing the heat-curable resin composition.

By using the composition of the invention, there can be provided a semiconductor device having a superior heat resistance and moisture resistance and barely exhibiting a warpage even after cooling a heat-cured encapsulated semiconductor element array that is obtained by mounting at least one semiconductor element on an inorganic substrate, a metal substrate or an organic substrate with an adhesive agent (die bonding material); or a heat-cured encapsulated large-diameter silicon wafer where semiconductor elements have been fabricated. Further, the present invention enables collective encapsulation of a whole wafer, and allows an encapsulation resin to be easily abraded and diced.

BRIEF DESCRIPTION OF THE DRAWINGS

FIG. 1 is a diagram showing a method for determining a glass-transition temperature.

DETAILED DESCRIPTION OF THE INVENTION

The present invention is described in detail hereunder. However, the present invention is not limited to the following examples.
(A) Cyanate Ester Compound
A component (A) is the main component of the composition of the present invention. Particularly, the component (A) is a cyanate ester compound having not less than two cyanato groups, and includes a compound represented by the following formula (1).

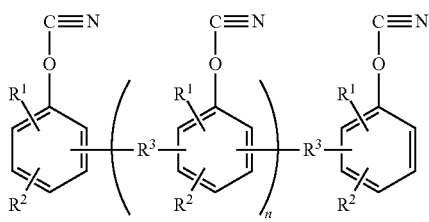

(1)

(In the formula (1), each of $R^1$ and $R^2$ represents a hydrogen atom or an alkyl group having 1 to 4 carbon atoms; $R^3$ represents a divalent linking group selected from the groups expressed by the following formulae (2) to (5); and n represents an integer of 0 or 1.)

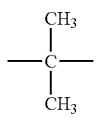

—CH$_2$— (2)

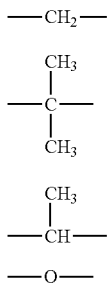

(3)

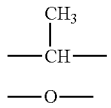

(4)

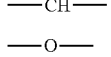

—O— (5)

It is preferred that the compound represented by the above formula (1) exhibit a viscosity of not higher than 50 Pa·s, particularly not higher than 20 Pa·s, at 23° C. when measured by a B-type rotatory viscometer in accordance with a method as described in JIS K7117-1:1999. A viscosity greater than 50 Pa·s makes it impossible to perform high filling of an inorganic filler, which leads to a larger expansion coefficient of the cured resin composition. Therefore, a significant warpage of the cured resin composition may occur in such case, if the composition of the invention is to be molded on a wafer of a size of not smaller than 12 inches. Thus, the cured resin composition may not be able to be formed into a sheet-like shape under such condition.

It is preferred that the compound represented by the formula (1) be added in an amount of not smaller than 90% by mass with respect to the whole cyanate ester compound. If such amount is smaller than 90% by mass, high filling of an inorganic filler cannot be performed, which leads to a concern that the cured resin composition of the present invention may not be able to be formed into a sheet-like shape.

In the present invention, one kind of the cyanate ester compound represented by the formula (1) may be used singularly; or mixed with an other cyanate ester compound(s) before use, which makes two or more kinds of them. Other cyanate ester compounds are defined as a cyanate ester compound other than that represented by the above formula (1) but still having not less than two cyanato groups. A known compound of such other cyanate ester compounds may be used. Examples of such other cyanate ester compound include bis (4-cyanatophenyl) methane; bis (3-methyl-4-cyanatophenyl) methane; bis (3,5-dimethyl-4-cyanatophenyl) methane; 1,1-bis (4-cyanatophenyl) ethane; 2,2-bis (4-cyanatophenyl) propane; 2,2-bis (4-cyanatophenyl)-1,1,1,3,3,3-hexafluoropropane; di (4-cyanatophenyl) thioether; 1,3-dicyanatobenzene; 1,4-dicyanatobenzene; 2-tert-butyl-1,4-dicyanatobenzene; 2,4-dimethyl-1,3-dicyanatobenzene; 2,5-di-tert-butyl-1,4-dicyanatobenzene; tetramethyl-1,4-dicyanatobenzene; 1,3,5-tricyanatobenzene; 2,2'-dicyanatobiphenyl; 4,4'-dicyanatobiphenyl; 3,3',5,5'-tetramethyl-4,4'-dicyanatobiphenyl; 1,3-dicyanatonaphthalene; 1,4-dicyanatonaphthalene; 1,5-dicyanatonaphthalene; 1,6-dicyanatonaphthalene; 1,8-dicyanatonaphthalene; 2,6-dicyanatonaphthalene; 2,7-dicyanatonaphthalene; 1,3,6-tricyanatonaphthalene; 1,1,1-1 tris (4-cyanatophenyl) ethane; bis (4-cyanatophenyl) ether; 4,4'-(1,3-phenylenediisopropylidene) diphenylcyanate; bis (4-cyanatophenyl) thioether; bis (4-cyanatophenyl) sulfone; tris (4-cyanatophenyl) phosphine; a phenol novolac-type cyanate; a cresol novolac-type cyanate; and a dicyclopentadiene novolac-type cyanate.

It is preferred that the cyanate ester compound as the component (A) be added in an amount of 80 to 99% by mass, more preferably 85 to 99% by mass, most preferably 90 to 97% by mass, with respect to the whole resin composition.

(B) Phenol Curing Agent

A component (B) is a phenol curing agent containing a resorcinol-type phenolic resin represented by the following formula (6).

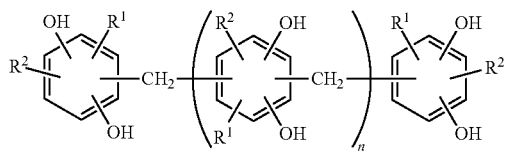

(6)

(In the formula (6), n represents an integer of 0 to 10; each of $R^1$ and $R^2$ independently represents a hydrogen atom or a monovalent group selected from the group consisting of an alkyl group having 1 to 10 carbon atoms, an allyl group and a vinyl group.)

It is preferred that "n" in the above formula (6) be 0 to 10 in terms of melt fluidity of the resin composition. If "n" is greater than 10, the resin composition will not melt at a temperature of 100° C. or lower, thus resulting in an impaired fluidity. As such component (B), there may be used in combination two or more kinds of the resorcinol-type phenolic resins (formula (6)) with different values of "n," or there may be used a resorcinol-type phenolic resin (formula (6)) whose value of "n" ranges in distribution. It is preferred that each of $R^1$ and $R^2$ in the formula (6) be a hydrogen atom or a monovalent group selected from the group consisting of an alkyl group having 1 to 10 carbon atoms, an allyl group and a vinyl group. It is particularly preferred that each of these $R^1$ and $R^2$ be a hydrogen atom or a monovalent group selected from the group consisting of an alkyl group having 1 to 4 carbon atoms, an allyl group and a vinyl group. $R^1$ and $R^2$ may represent functional groups that differ from each other. Here, when employing a group having more than 10 carbon atoms, a sufficient heat resistance of the cured resin composition cannot be achieved if the group employed is an aliphatic group; whereas the melt fluidity of the resin composition will be impaired if the group employed is an aryl group.

As for a compounding ratio between the component (A) and the phenol curing agent (B), it is preferred that the cyanato groups (CN groups) in the cyanate ester compound as the component (A) and having not less than two cyanato groups (CN groups) be in an amount of 0.5 to 100 equivalents, more preferably 1 to 50 equivalents, even more preferably 5 to 35 equivalents, with respect to 1 equivalent of the hydroxyl groups (OH groups) in the resorcinol-type phenolic resin represented by the formula (6). If such cyanato groups are in an amount of greater than 100 equivalents, the curing of the resin composition may take place in an insufficient manner; whereas an amount of smaller than 0.5 equivalents may lead to an impaired heat resistance of the cyanate ester compound itself.

By containing the resorcinol-type phenolic resin represented by the above formula (6), the phenol curing agent is capable of reducing a resin viscosity at the time of melting the resin composition; and promoting the curing reaction of the cyanate ester compound. Further, since the resorcinol-type phenolic resin itself has a high heat resistance, there can be obtained a cured product having a superior heat resistance.

(C) Curing Accelerator

Examples of a component (C) include 1,8-diazabicyclo [5.4.0] undecene-7 (DBU); 1,5-diazabicyclo [4.3.0] nonene-5 (DBN); N-alkyl substitution and N-aryl substitution of these compounds; salts of these nitrogen-containing heterocyclic compounds; and amine-based curing accelerators. It is preferred that the curing accelerator as the component (C) be added in an amount of not larger than 5 parts by mass, more preferably 0.01 to 5 parts by mass, with respect to 100 parts by mass of the cyanate ester resin as the component (A) and having not less than two cyanato groups.

Specific examples of a DBU salt include a phenol salt of DBU, an octylic acid salt of DBU, a p-toluenesulfonic acid salt of DBU, a formic acid salt of DBU, an orthophthalic acid salt of DBU, a trimellitic anhydride salt of DBU, a phenol novolac resin salt of DBU and a tetraphenylborate salt of DBU. Meanwhile, specific examples of a DBN salt include a phenol salt of DBN, an octylic acid salt of DBN, a p-toluenesulfonic acid salt of DBN, a formic acid salt of DBN, an orthophthalic acid salt of DBN, a trimellitic anhydride salt of DBN, a phenol novolac resin salt of DBN and a tetraphenylborate salt of DBN.

Examples of an amine-based curing accelerator include an aromatic amine-based curing accelerator such as 3,3'-diethyl-4,4'-diaminodiphenylmethane, 3,3',5,5'-tetramethyl-4, 4'-diaminodiphenylmethane, 3,3',5,5'-tetraethyl-4,4'-diaminodiphenylmethane, 2,4-diaminotoluene, 1,4-phenylenediamine, 1,3-phenylenediamine, diethyltoluenediamine, 3,4'-diaminodiphenyl ether, 3,3'-diaminodiphenylmethane, 3,4'-diaminodiphenylmethane, 4,4'-diaminodiphenylmethane, 3,3'-diaminobenzidine, orthotolidine, 3,3'-dimethyl-4,4'-diaminodiphenylmethane, 2,6-diaminotoluene and 1,8-diaminonaphthalene. Other examples of the amine-based curing accelerator of the present invention include a chain aliphatic polyamine such as N,N'-bis (3-aminopropyl) ethylenediamine, 3,3'-diaminodipropylamine, 1,8-diaminooctane, 1,10-diaminodecane, diethylenetriamine, triethylenetetramine and tetraethylenepentamine; a cycloaliphatic polyamine such as 1,4-bis (3-aminopropyl) piperazine, N-(2-aminoethyl) piperazine, N-(2-aminoethyl) morpholine and isophoronediamine; polyamidoamine; an imidazole-based curing accelerator; and a guanidine-based curing accelerator. The aforementioned polyamidoamine is prepared by condensation of dimer acid and polyamine. Examples of such polyamidoamine include adipic acid dihydrazide and 7,11-octadecadiene-1,18-dicarbohydrazide. Examples of the aforementioned imidazole-based curing accelerator include 2-methylimidazole, 2-ethyl-4-methylimidazole and 1,3-bis (hydrazinocarbonoethyl)-5-isopropylhydantoin. Examples of the aforementioned guanidine-based curing accelerator include aliphatic amines such as 1,3-diphenylguanidine and 1,3-o-triguanidine. Particularly, it is preferred that a tertiary amine, a tertiary amine salt or an imidazole-based curing accelerator be used.

(D) Inorganic Filler

As an inorganic filler added to the composition of the present invention, there may be used those normally added to an epoxy resin composition. Specific examples of such inorganic filler include silicas such as a molten silica and a crystalline silica; alumina; silicon nitride; aluminum nitride; boron nitride; titanium oxide; and glass fibers.

It is preferred that such inorganic filler be spherical; and have an average particle diameter of 1 to 20 μm, particularly 3 to 15 μm when measured by a laser diffraction method. Moreover, such inorganic filler is surface-treated with a silane coupling agent represented by the following formula (7).

(In the formula (7), $R^1$ represents a methyl group or an ethyl group; $R^2$ represents an alkyl group having 1 to 3 carbon atoms; $R^3$ represents a group selected from the group consisting of the nitrogen-containing functional groups represented by the following formulae (8) to (11); and a represents an integer of 0 to 3.)

The above treatment leads to a superior affinity for the cyanate ester, and is capable of strengthening the bond with the inorganic filler and significantly improving the fluidity of the composition. A known method may be employed as such surface treatment method using the silane coupling agent. In fact, there are no particular restrictions on this surface treatment method.

It is preferred that the silane coupling agent represented by the formula (7) be added in an amount of 0.2 to 0.5 parts by mass with respect to 100 parts by mass of the inorganic filler. When the silane coupling agent is added in a small amount, the cyanate ester and the inorganic filler may not be bonded sufficiently, or there may not be achieved a sufficient fluidity of the composition. Meanwhile, a larger expansion coefficient may be resulted if the silane coupling agent is added in a large amount.

It is preferred that the component (D) be added in an amount of 1,200 to 2,200 parts by mass, more preferably 1,400 to 2,000 parts by mass, with respect to 100 parts by mass of a sum total of the components (A) and (B). When the component (D) is added in an amount smaller than such lower limit value, a post-molding warpage of the cured resin composition becomes significant in a way such that there cannot be achieved a sufficient strength thereof. Further, an amount larger than such upper limit value leads to a significantly impaired fluidity of the resin composition in a way such that a semiconductor element(s) arranged on a submount cannot be completely encapsulated.

(E) Other Additives

The heat-resistant resin composition of the present invention is obtained by combining the above components (A) to (D) in given amounts. However, other additives may also be added to the composition of the invention if necessary, without impairing the objectives and effects of the present invention. Examples of such additives include an inorganic filler, a mold release agent, a flame retardant, an ion trapping agent, an antioxidant, an adhesion imparting agent, a low stress agent and a coloring agent.

The flame retardant is added to impart a flame retardant property. Here, all the known flame retardants may be used in the present invention. Examples of such flame retardant include a phosphazene compound, a silicone compound, a zinc molybdate-supported talc, a zinc molybdate-supported zinc oxide, aluminum hydroxide, magnesium hydroxide and molybdenum oxide.

The ion trapping agent is added to trap the ion impurities contained in the resin composition, and avoid a thermal degradation and a moisture absorption degradation. Here, all the known ion trapping agents may be used in the present invention. Examples of such ion trapping agents include hydrotalcites, a bismuth hydroxide compound and rare-earth oxides.

The adhesion imparting agent is added to impart an adhesion with respect to a chip and a substrate that are encapsulated. Here, all the known adhesion imparting agents may be used in the present invention. Examples of such adhesion imparting agents include a silane compound and a polysiloxane compound each having in molecules a hydrolyzable silyl group(s); and an adhesive functional group(s) such as a vinyl group, an amino group, an epoxy group, (metha) acrylic group and a mercapto group.

Examples of such silane compound include vinyltrimethoxysilane, vinyltriethoxysilane, 2-(3,4-epoxycyclohexyl) ethyltrimethoxysilane, γ-glycidoxypropyltrimethoxysilane, γ-glycidoxypropyltriethoxysilane, γ-glycidoxypropylmethyldiethoxysilane, γ-methacryloxypropylmethyldiethoxysilane, γ-acryloxypropyltrimethoxysilane, N-2-(aminoethyl)-3-aminopropyltrimethoxysilane, N-2-(aminoethyl)-3-aminopropylmethyldiethoxysilane, N-phenyl-3-aminopropyltrimethoxysilane, γ-aminopropyltrimethoxysilane and γ-mercaptopropyltrimethoxysilane. Further, the above polysiloxane compound may be circular, chainlike or netlike.

Although the amount of the component (E) added varies depending on the intended purpose of the composition, it is normally added in an amount of not larger than 20% by mass with respect to the whole composition.

Production Method of Heat-Curable Resin Composition of the Invention

The heat-curable resin composition of the present invention can, for example, be prepared through the method shown below.

In the beginning, a mixture of the components (A) and (B) is obtained by simultaneously or separately mixing, stirring, and/or dispersing the cyanate ester compound (A) and the phenol curing agent (B) while performing a heating treatment if necessary. A mixture of the components (A) to (C) is then obtained by mixing, stirring, and/or dispersing the curing accelerator (C) and the mixture of the components (A) and (B). Further, a mixture of the components (A) to (D) is obtained by mixing, stirring, and/or dispersing the inorganic filler (D) and the mixture of the components (A) to (C). In addition, at least one of the mold release agent, flame retardant and ion trapping agent as an additive(s) may be added to mixed with the mixture of the components (A) and (B), the mixture of the components (A) to (C), and the mixture of the components (A) to (D).

There are no particular restrictions on a device(s) for performing, for example, mixing, stirring and dispersion. However, specific examples of such device(s) include a kneader equipped with a stirring and heating devices, a twin-roll mill, a triple-roll mill, a ball mill, a continuous extruder, a planetary mixer and a mass-colloider. These devices may also be appropriately used in combination.

The heat-curable resin composition of the present invention can be molded through the conventional compression molding or laminating molding. Particularly, it is preferred that compression molding be performed. In such case, it is preferred that the composition be molded at a molding temperature of 160 to 180° C. for 300 to 600 sec, and that post-curing be then performed at 160 to 180° C. for 1 to 6 hours.

An insignificant warpage is observed in the composition of the present invention when molded on 8 inch, 12 inch and 20 inch wafers. Further, the cured resin composition of the present invention is superior in mechanical strength and insulation properties, and a semiconductor device encapsulated by such cured product is superior in long-term reliability. Moreover, the composition of the invention is also superior in productivity due to the fact that molding failures such as flow mark and filling failure will not occur even when using the device(s) for conventional molding such as compression or laminating molding under appropriate condition(s) for these device(s).

A flow mark referred to in this specification is a white flow mark radially formed from the center of the molded product toward the outer side. The occurrence of such flow mark may lead to, for example, a poor appearance; a variation in the properties of the cured product due to an ununiformly dispersed silica; and an impaired reliability associated with such variation.

A filling failure referred to in this specification refers to a missing portion of resin that occurs on the outer circumferential region of a wafer. The occurrence of such filling failure may cause a sensor to erroneously recognize the unfilled portion as a notch when transporting the wafer in a later step(s). There, a position adjustment property may be impaired.

WORKING EXAMPLE

Described below are working examples of the present invention. However, the present invention is not limited to the following examples. Here, a viscosity referred to in this specification is a viscosity measured by a B-type rotary viscometer at 23° C., in accordance with a method described in JIS K7117-1:1999.

Production Method of Sheet-Like Heat-Curable Resin Composition

A heat-curable resin composition was obtained by mixing all the following components as those contained in the heat-curable resin composition at the ratios shown in Table 1, and then kneading the same with a twin-roll mill. In Table 1, the unit for the numerical values representing the compounding ratios is "part by mass." The mixture of the heat-curable resin composition obtained above was applied to the surface of a polyester film (protection layer) treated by a mold release treatment, followed by using a heated roll mill to form the mixture to a thickness of 100 µm. In this way, obtained were sheet-like cured products of working examples 1 to 8 and comparative examples 1 to 7. In comparative examples 3, 5, 6 and 7, a poor wettability was observed between the resin and the inorganic filler such that the composition of the invention failed to be formed into a sheet-like shape. The following tests and evaluations were then performed on the compositions that had failed to be formed into a sheet-like shape(s).

(A) Cyanate Ester Compound (A1) 1,1-bis (4-cyanatophenyl) ethane represented by the following formula (12) (viscosity: 0.08 Pa·s) (product name: LECY by LONZA Group Ltd.)

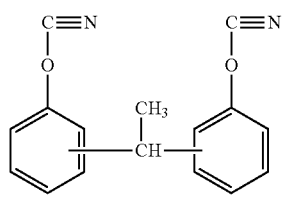

(A2) Phenol novolac-type cyanate ester represented by the following formula (13) (n=0 to 2) (viscosity: 250 Pa·s) (product name: PT30 by LONZA Group Ltd.)

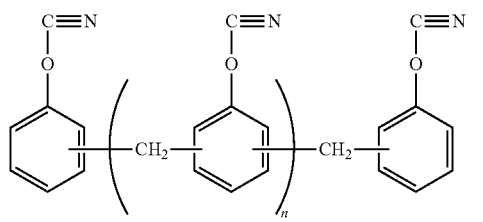

(B) Phenol Curing Agent (B1) Resorcinol-type phenolic resin represented by the following formula (14) (n=0 to 4; each of $R^1$ and $R^2$ represents an allyl group; weight-average molecular weight 450 to 600; equivalent 107) (product name: MEH-8400 by MEIWA PLASTIC INDUSTRIES, LTD)

(B2) Resorcinol-type phenolic resin represented by the following formula (14) (n=5 to 7; each of $R^1$ and $R^2$ represents an allyl group; weight-average molecular weight 800 to 1,100; equivalent 132) (by MEIWA PLASTIC INDUSTRIES, LTD)

(B3) Resorcinol-type phenolic resin represented by the following formula (14) (n=0 to 4; each of $R^1$ and $R^2$ represents an n-propyl group; weight-average molecular weight 450 to 600; equivalent 107) (by MEIWA PLASTIC INDUSTRIES, LTD)

(B4) Resorcinol-type phenolic resin represented by the following formula (14) (n=0 to 4; each of $R^1$ and $R^2$ represents an vinyl group; weight-average molecular weight 450 to 600; equivalent 107) (by MEIWA PLASTIC INDUSTRIES, LTD)

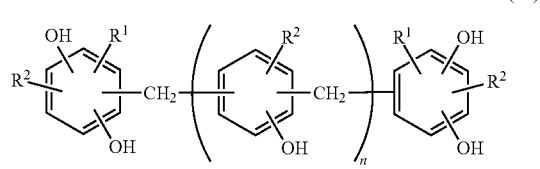

(B5) Arylphenol novolac (product name: MEH-8000H by MEIWA PLASTIC INDUSTRIES, LTD; equivalent 141)

(C) Curing Accelerator (C1) DBU-type tetraphenylborate salt (product name: U-CAT 5002 by by San-Apro Ltd.)

(D) Inorganic Filler (D1) Treated Silica

A treated silica (D1) was prepared by performing dry surface treatment on 100 parts by mass of a spherical molten silica (spherical molten silica with an average particle diameter of 12 µm (by TATSUMORI LTD.)) with 0.3 parts by mass of an N-phenyl-3-am inopropyltrimethoxysilane (product name: KBM573 by Shin-Etsu Chemical Co., Ltd.).

(D2) Treated Silica

A treated silica (D2) was prepared by performing dry surface treatment on 100 parts by mass of a spherical molten silica (spherical molten silica with an average particle diameter of 12 µm (by TATSUMORI LTD.)) with 0.3 parts by mass of a γ-glycidoxypropyltrimethoxysilane (product name: KBM403 by Shin-Etsu Chemical Co., Ltd.).

(D3) Treated Silica

A treated silica (D3) was prepared by performing dry surface treatment on 100 parts by mass of a spherical molten silica (spherical silica with an average particle diameter of 0.8 µm (by TATSUMORI LTD.)) with 0.3 parts by mass of the N-phenyl-3-aminopropyltrimethoxysilane (product name: KBM573 by Shin-Etsu Chemical Co., Ltd.).

(D4) Non-Treated Silica

The spherical molten silica used in (D1) (by TATSUMORI LTD., average particle diameter of 12 µm) was used without performing surface treatment thereon.

(E) Other Additives (E1) Adhesion imparting agent: γ-glycidoxypropyltrimethoxysilane (product name: KBM403 by Shin-Etsu Chemical Co., Ltd.).

(E2) Coloring agent: carbon black (product name: Mitsubishi carbon black 3230MJ by Mitsubishi Chemical Corporation)

Test and Evaluation Method

Glass-Transition Temperature and Linear Expansion Coefficient

Each of the sheet-like cured products produced in the working and comparative examples in accordance with JIS K 7197: 2012, was processed into a specimen of a size of 5×5×15 mm, followed by placing the same in a thermal dilatometer TMA 8140C (by Rigaku Corporation). A change in size of the specimen was then measured while constantly applying a pressure of 19.6 mN to the specimen within a temperature from 25° C. to 300° C. at an increasing ratio of 5° C./min. The correlation between such change in size and the temperatures was then plotted on a graph. The glass-transition temperatures in the working and comparative examples were later obtained based on such graph showing the correlation between the change in size and the temperatures, and through the following method for determining the glass-transition temperature(s).

Method for Determining Glass-Transition Temperature

In FIG. 1, $T_1$ and $T_2$ represent two arbitrary temperatures that are not higher than the temperature at the inflection point and by which a tangent line to the size change-temperature curve can be drawn; whereas $T_1'$ and $T_2'$ represent two arbitrary temperatures that are not lower than the temperature at the inflection point and by which a similar tangent line can be drawn. $D_1$ and $D_2$ individually represent a change in size at $T_1$ and a change in size at $T_2$; whereas $D_1'$ and $D_2'$ individually represent a change in size at $T_1'$ and a change in size at $T_2'$. The glass-transition temperature (Tg) is then defined as the temperature at the point of intersection between a straight line connecting points $(T_1, D_1)$ and $(T_2, D_2)$ and a straight line connecting points $(T_1', D_1')$ and $(T_2', D_2')$. The slope between $T_1$ and $T_2$ is defined as a linear expansion coefficient (linear expansion coefficient 1) of a region where the temperature is not larger than Tg, whereas the slope between $T_1'$ and $T_2'$ is defined as a linear expansion coefficient (linear expansion coefficient 2) of a region where the temperature is not smaller than Tg.

Evaluation on Existence or Non-Existence of Flow Mark and Filling Failure

The liquid resin composition was subjected to compression molding at 175° C. for 600 sec to obtain a molded product of a resin thickness of 300 μm, followed by completely curing (i.e. post-curing) the same under a condition of 180° C. for 1 hour. Later, the existence or non-existence of the flow mark and/or filling failure was evaluated by visually observing the appearance of the cured product.

Warpage Measurement

Using a 12-inch silicon wafer of a thickness of 775 μm, the liquid resin composition was subjected to compression molding in a wafer mold by APIC YAMADA CORPORATION at 175° C. for 600 sec to obtain a molded product of a resin thickness of 300 μm, followed by completely curing (i.e. post-curing) the same under the condition of 180° C. for 1 hour. Warpage (mm) was measured thereafter.

Reliability Test

Semiconductor chips were prepared as follows. That is, a screen printer for thick film (THICK FILM PRINTER TYPE MC 212) was used to print on an 8-inch silicon wafer of a thickness of 200 μm a die bonding material SFX-513M1 (by Shin-Etsu Chemical Co., Ltd.) at a thickness of 20 μm. A dicing apparatus was then used to cut the printed specimen into 7-mm dices while the specimen was still in B-stage.

Next, a flip chip bonder (NM-SB50A by Panasonic Corporation) was used to bond the die bonding material-adhered semiconductor chips (7 mm×7 mm and 220 μm thickness) to the 8-inch and 200 μm-thick silicon wafer, under a condition of 10N, 150° C. and 1.0 sec. In this way, there was obtained a silicon wafer with the semiconductor chips mounted thereon and having a thickness of 200 μm.

The semiconductor chip-mounted silicon wafer of the thickness of 200 μm was then placed in a compression molding device, followed by placing thereon an appropriate amount of the liquid resin composition so as to cure the liquid resin composition at 110° C. for 10 min, where a maximum value of the molding pressure applied was 15 to 30 MPa. A silicon wafer was thus obtained. The amount of the liquid resin composition was adjusted to that allowing the resin thickness to become 400 μm±10 μm after molding. Such silicon wafer was then subjected to post-curing where the silicon wafer was heat-treated in an oven at 150° C. for 2 hours. Later, a dicing apparatus was again used to cut the post-cured silicon wafer into 7.1 mm×7.1 mm dices, thus obtaining a separated resin-mounted semiconductor chip having a thickness of 400 μm.

The flip chip bonder (NM-SB50A by Panasonic Corporation) was used to bond the separated resin-mounted semiconductor chips to a BT substrate with a die bonding material SFX-513S (by Shin-Etsu Chemical Co., Ltd.), under a condition of 10N, 150° C. and 1.5 sec. Post-curing was then performed through a heat treatment in an oven at 150° C. for 4 hours, thus obtaining a BT substrate where the resin-mounted semiconductor chips had been bonded.

A transfer molding machine (G-LINE Press by APIC YAMADA CORPORATION) was used to mold a molding compound material to a thickness of 1.5 mm on the BT substrate where the resin-mounted semiconductor chips had been bonded, under a molding condition of 175° C., 90 sec and 9 MPa. Later, a dicing apparatus was again used to cut the BT substrate into 10.0 mm×10.0 mm dices, thus obtaining the separated BT substrate (semiconductor device) where the molding compound resin-mounted semiconductor chip had been bonded.

The above semiconductor device was then subjected to a hygroscopic treatment for 168 hours under a condition of 85° C. and 85% RH. The semiconductor device thus treated was further subjected to a solder heat resistance test (peeling inspection) where the semiconductor device was inserted through a reflow oven three times, the reflow oven being previously configured in a manner such that a temperature range was within 255 to 260° C. (i.e. maximum temperature 260° C.) for 30 sec±3 sec. An ultrasonic flaw detector (QUANTUM 350 by SONIX) was used to inspect a peeling state inside the semiconductor chips in a nondestructive manner with a 75 MHz probe. Here, examples exhibiting no peelings or cracks were marked "Favorable," whereas examples exhibiting peelings or cracks were marked "NG."

Temperature Cycle Test (TCT)

The separated BT substrate where the molding compound resin-mounted semiconductor chip had been bonded was subjected to a cycle of −55° C./15 min and then +125° C./15 min (Automatic), using a compact thermal shock chamber TSE-11 manufactured by ESPEC CORP. In the beginning, when 0 cycle had yet elapsed, the ultrasonic flaw detector (QUANTUM 350 by SONIX) was used to inspect the peeling state inside the semiconductor chip in the nondestructive manner with the 75 MHz probe. Later, similar inspections were individually performed after 250 cycles, 500 cycles and 700 cycles had elapsed. The inspection results are shown in Table 1. Examples where a sum total of peeled areas to an area of the semiconductor chip was less than 5% (minimal peeling) are marked "OK (no peeling)," whereas examples where the sum total of the peeled areas to the area of the semiconductor chip was 5% or more are marked "NG (peeling occurred)."

TABLE 1

| Composition (part by mass) | | Working example | | | | | | | |
|---|---|---|---|---|---|---|---|---|---|
| | | 1 | 2 | 3 | 4 | 5 | 6 | 7 | 8 |
| (A) Cyanate ester compound | (A1) | 95 | 95 | 95 | 95 | 90 | 97 | 95 | 95 |
| | (A2) | | | | | 5 | | | |

TABLE 1-continued

|  |  |  |  |  |  |  |  |  |  |
|---|---|---|---|---|---|---|---|---|---|
| (B) Phenol curing agent | (B1) | 5 |  |  |  | 5 | 3 | 5 | 5 |
|  | (B2) |  | 5 |  |  |  |  |  |  |
|  | (B3) |  |  | 5 |  |  |  |  |  |
|  | (B4) |  |  |  | 5 |  |  |  |  |
|  | (B5) |  |  |  |  |  |  |  |  |
| (C) Curing accelerator | (C1) | 0.5 | 0.5 | 0.5 | 0.5 | 0.5 | 0.5 | 0.5 | 0.5 |
| (D) Inorganic filler | (D1) Treated silica | 1850 | 1850 | 1850 | 1850 | 1850 | 1850 | 2000 | 1400 |
|  | (D2) Treated silica |  |  |  |  |  |  |  |  |
|  | (D3) Treated silica |  |  |  |  |  |  |  |  |
|  | (D4) Non-treated silica |  |  |  |  |  |  |  |  |
| (E) Other additives | (E1) Adhesion imparting agent | 1 | 1 | 1 | 1 | 1 | 1 | 1 | 1 |
|  | (E2) Carbon black | 1 | 1 | 1 | 1 | 1 | 1 | 1 | 1 |
| Evaluation item | Sheet-like shape | Favorable | Favorable | Favorable | Favorable | Favorable | Favorable | Favorable | Favorable |
|  | Glass-transition temperature [Tg](° C.) | 220 | 225 | 225 | 210 | 240 | 230 | 220 | 220 |
|  | Linear expansion coefficient (ppm/° C.) | 4.1 | 4.0 | 4.0 | 4.1 | 4.1 | 4.0 | 3.8 | 4.5 |
|  | Flow mark (Yes•No) | No | No | No | No | No | No | No | No |
|  | Filling failure (Yes•No) | No | No | No | No | No | No | No | No |
|  | Warpage amount(mm) | <1 | <1 | <1 | <1 | <1 | <1 | <1 | 2 |
| Reliability test | Presence or absence of peeling, crack (IR reflow) | Favorable | Favorable | Favorable | Favorable | Favorable | Favorable | Favorable | Favorable |
| Temperature cycle test | 0 cycles | OK | OK | OK | OK | OK | OK | OK | OK |
|  | 250 cycles | OK | OK | OK | OK | OK | OK | OK | OK |
|  | 500 cycles | OK | OK | OK | OK | OK | OK | OK | OK |
|  | 750 cycles | OK | OK | OK | OK | OK | OK | OK | OK |

|  |  | Comparative example |  |  |  |  |  |  |
|---|---|---|---|---|---|---|---|---|
| Composition (part by mass) |  | 1 | 2 | 3 | 4 | 5 | 6 | 7 |
| (A) Cyanate ester compound | (A1) | 95 | 90 | 95 | 95 | 95 | 95 | 95 |
|  | (A2) |  |  |  |  |  |  |  |
| (B) Phenol curing agent | (B1) |  |  | 5 | 5 | 5 | 5 | 5 |
|  | (B2) |  |  |  |  |  |  |  |
|  | (B3) |  |  |  |  |  |  |  |
|  | (B4) |  |  |  |  |  |  |  |
|  | (B5) | 5 | 10 |  |  |  |  |  |
| (C) Curing accelerator | (C1) | 0.5 | 0.5 | 0.5 | 0.5 | 0.5 | 0.5 | 0.5 |
| (D) Inorganic filler | (D1) Treated silica | 1850 | 1850 |  | 1150 | 2300 |  |  |
|  | (D2) Treated silica |  |  | 1850 |  |  |  |  |
|  | (D3) Treated silica |  |  |  |  |  | 1850 |  |
|  | (D4) Non-treated silica |  |  |  |  |  |  | 1850 |
| (E) Other additives | (E1) Adhesion imparting agent | 1 | 1 | 1 | 1 | 1 | 1 | 1 |
|  | (E2) Carbon black | 1 | 1 | 1 | 1 | 1 | 1 | 1 |
| Evaluation item | Sheet-like shape | Favorable | Favorable | Failed to be molded into sheet-like shape | Favorable | Failed to be molded into sheet-like shape | Failed to be molded into sheet-like shape | Failed to be molded into sheet-like shape |
|  | Glass-transition temperature [Tg](° C.) | 195 | 190 | | 220 | | | |
|  | Linear expansion coefficient (ppm/° C.) | 4.3 | 4.5 | (NA) | 5.2 | (NA) | (NA) | (NA) |
|  | Flow mark (Yes•No) | No | No |  | No |  |  |  |

TABLE 1-continued

| | | | | |
|---|---|---|---|---|
| | Filling failure (Yes•No) | No | No | No |
| | Warpage amount(mm) | 8 | 5 | 12 |
| Reliability test | Presence or absence of peeling, crack (1R reflow) | NG | NG | NG |
| Temperature cycle test | 0 cycles | NG | NG | NG |
| | 250 cycles | NG | NG | NG |
| | 500 cycles | NG | NG | NG |
| | 750 cycles | NG | NG | NG |

Results

With regard to the phenol curing agent as the component (B), larger amounts of warpage (mm) were confirmed when using the phenol curing agent (B5) as a curing agent other than the resorcinol-type phenolic resins (B1) to (B4) (comparative example 1). Further, larger amounts of warpage (mm) were still confirmed as compared to working examples 1 to 8, even after doubling the used amount of the phenol curing agent (B5). With regard to the inorganic filler as the component (D), the resin composition failed to be formed into a sheet-like shape as a result of using D2 to D4 (comparative examples 3, 6 and 7) and when high filling of D1 was performed excessively (comparative example 5). Further, a smaller amount of the inorganic filler added led to a larger amount of warpage and the occurrence of peelings and cracks (comparative examples 4).

Based on the above results, the following were confirmed with the resin composition of the invention. That is, the resin composition of the invention has a high glass-transition temperature, a high fluidity and a high heat resistance. Further, the resin composition of the invention exhibits a small degree of warpage and undergoes small degrees of expansion and contraction. Furthermore, the resin composition of the invention is capable of being formed into a sheet-like shape.

What is claimed is:

1. A heat-curable resin composition for semiconductor encapsulation, comprising:
   (A) a cyanate ester compound having not less than two cyanato groups in one molecule, said cyanate ester compound containing a cyanate ester compound (A-1) represented by the following formula (1) and exhibiting a viscosity of not higher than 50 Pas when measured by a B-type rotary viscometer at 23° C. in accordance with a method described in JIS K7117-1:1999

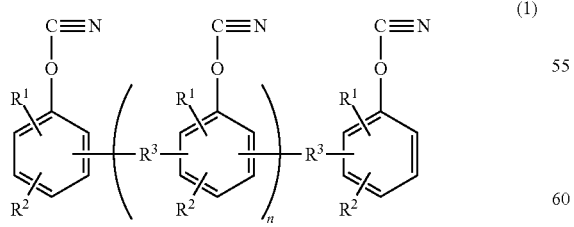

(1)

wherein n represents an integer of 0 or 1; each of $R^1$ and $R^2$ represents a hydrogen atom or an alkyl group having 1 to 4 carbon atoms; and $R^3$ represents a divalent linking group selected from the groups expressed by the following formulae (2) to (5)

$$—CH_2— \quad (2)$$

$$\begin{array}{c} CH_3 \\ | \\ —C— \\ | \\ CH_3 \end{array} \quad (3)$$

$$\begin{array}{c} CH_3 \\ | \\ —CH— \end{array} \quad (4)$$

$$—O— \quad (5)$$

(B) a phenol curing agent containing a resorcinol-type phenolic resin represented by the following formula (6)

(6)

wherein n represents an integer of 0 to 10; each of $R^1$ and $R^2$ independently represents a hydrogen atom or a monovalent group selected from the group consisting of an alkyl group having 1 to 10 carbon atoms, an allyl group and a vinyl group;

(C) a curing accelerator; and (D) an inorganic filler that is spherical, has an average particle diameter of 1 to 20 μm when measured by a laser diffraction method, has been surface-treated with a silane coupling agent represented by the following formula (7) and is added in an amount of 1,200 to 2,200 parts by mass with respect to 100 parts by mass of a sum total of said components (A) and (B)

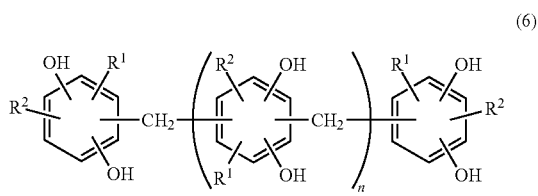

$$R^1_a(OR^2)_{(3-a)}Si—C_3H_6—R^3 \quad (7)$$

wherein a represents an integer of 0 to 3; $R^1$ represents a methyl group or an ethyl group; $R^2$ represents an alkyl group having 1 to 3 carbon atoms; and $R^3$ represents a group selected from the group consisting of the nitrogen-containing functional groups represented by the following formulae (8) to (11)

$$—NH_2 \quad (8)$$

-continued

 (9)

 (10)

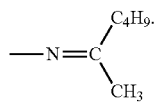 (11)

2. The heat-curable resin composition for semiconductor encapsulation according to claim 1, wherein said component (A) contains two or more kinds of cyanate ester compounds including at least one kind of said cyanate ester compound (A-1), and said cyanate ester compound (A-1) is in an amount of not smaller than 90% by mass, but smaller than 100% by mass with respect to a whole amount of said component (A) added.

3. The heat-curable resin composition for semiconductor encapsulation according to claim 1, wherein said resorcinol-type phenolic resin represented by the following formula (6) is in an amount of 10 to 100% by mass with respect to a whole amount of said component (B) added, and cyanato groups in said cyanate ester compound as said component (A) are in an amount of 0.5 to 100 equivalents with respect to 1 equivalent of hydroxyl group in said phenol curing agent as said component (B).

4. The heat-curable resin composition for semiconductor encapsulation according to claim 2, wherein said resorcinol-type phenolic resin represented by the following formula (6) is in an amount of 10 to 100% by mass with respect to a whole amount of said component (B) added, and cyanato groups in said cyanate ester compound as said component (A) are in an amount of 0.5 to 100 equivalents with respect to 1 equivalent of hydroxyl group in said phenol curing agent as said component (B).

5. The heat-curable resin composition for semiconductor encapsulation according to claim 1, wherein a linear expansion coefficient thereof is in a range of 3.0 to 5.0 ppm/° C. as a result of measuring a specimen of a size of 5×5×15 mm at an increasing rate of 5° C./min from 25 to 300° C. while constantly applying a pressure of 19.6 mN, in accordance with a method described in JIS K 7197:2012.

* * * * *